United States Patent [19]
Yamaguchi et al.

[11] Patent Number: 5,460,680
[45] Date of Patent: Oct. 24, 1995

[54] METHOD FOR MANUFACTURING MULTI-LAYER PRINTED BOARD

[75] Inventors: Shoji Yamaguchi; Akira Yamada; Yasuo Furuhashi; Fumiaki Baba, all of Hyogo, Japan

[73] Assignee: Mitsubishi Denki Kabushiki Kaisha, Tokyo, Japan

[21] Appl. No.: 183,920

[22] Filed: Jan. 19, 1994

Related U.S. Application Data

[63] Continuation of Ser. No. 968,288, Oct. 29, 1992.

[30] Foreign Application Priority Data

Nov. 8, 1991 [JP] Japan ................................. 3-292892
Nov. 11, 1991 [JP] Japan ................................. 3-293985
Jun. 25, 1992 [JP] Japan ................................. 4-167360

[51] Int. Cl.⁶ ............................ B32B 31/04; B32B 31/20
[52] U.S. Cl. ........................... 156/289; 156/293; 156/323
[58] Field of Search ................................. 156/289, 293, 156/297, 300, 323

[56] References Cited

U.S. PATENT DOCUMENTS

| 4,106,187 | 8/1978 | Smith et al. | 29/847 |
| 4,636,275 | 1/1987 | Norell | 156/289 |
| 4,680,075 | 7/1987 | McNeal et al. | 156/289 |
| 4,737,208 | 4/1988 | Bloechle, Jr. et al. | 156/289 X |
| 5,116,440 | 5/1992 | Takeguchi et al. | 156/289 X |

FOREIGN PATENT DOCUMENTS

3-194998 12/1989 Japan.

Primary Examiner—David A. Simmons
Assistant Examiner—M. Curtis Mayes
Attorney, Agent, or Firm—Wolf, Greenfield & Sacks

[57] ABSTRACT

A method for producing multi-layer printed board. The method includes heating a hole board as a top layer, an adhesive sheet, and a bottom layer board. The adhesive sheet includes a mold release sheet and a thermoplastic resin sheet which begins to soften at a temperature lower than the melting temperature of the adhesive. A contraction control member controls contraction when the thermoplastic resin sheet cools.

10 Claims, 10 Drawing Sheets

METHOD FOR MANUFACTURING MULTI-LAYER PRINTED BOARD

This application is a continuation of application Ser. No. 07/968,288, filed Oct. 29, 1992.

BACKGROUND OF THE INVENTION

1. Field of the Invention

The invention relates to a method for producing multi-layer printed board, more specifically, a method for producing multi-layer printed board having holes on the top board thereof.

2. Description of the Prior Art

In the past, film-shaped adhesives were frequently used for producing a multi-layer printed board. When the adhesive is used for laminating the multi-layer printed hole board in the first layer, it is necessary to laminate the printed board so that the adhesive does not extrude into the holes of the layer, since modules are soldered onto the copper pattern in the holes. Therefore, holes of the film-shaped adhesive are perforated larger than those of the printed board so that the adhesive does not extrude into the holes of the printed board even if the adhesive melts when it is cured.

Another method is that the adhesive extruded into the holes is removed, for example, by a hot knife, after the melted adhesive is filled in the holes of the printed board without taking any means at adhesion.

Another method for manufacturing a multi-layer board is disclosed in the Japanese laid-open publication No. 3-194998, in which a dry film resist is provided on the outer surface of the metallic foil for filling the aperture end of the through-holes, then the heat and pressure are applied to the printed board so that the resin which forms the prepreg does not adhere to the metallic foil.

Figure 10A:
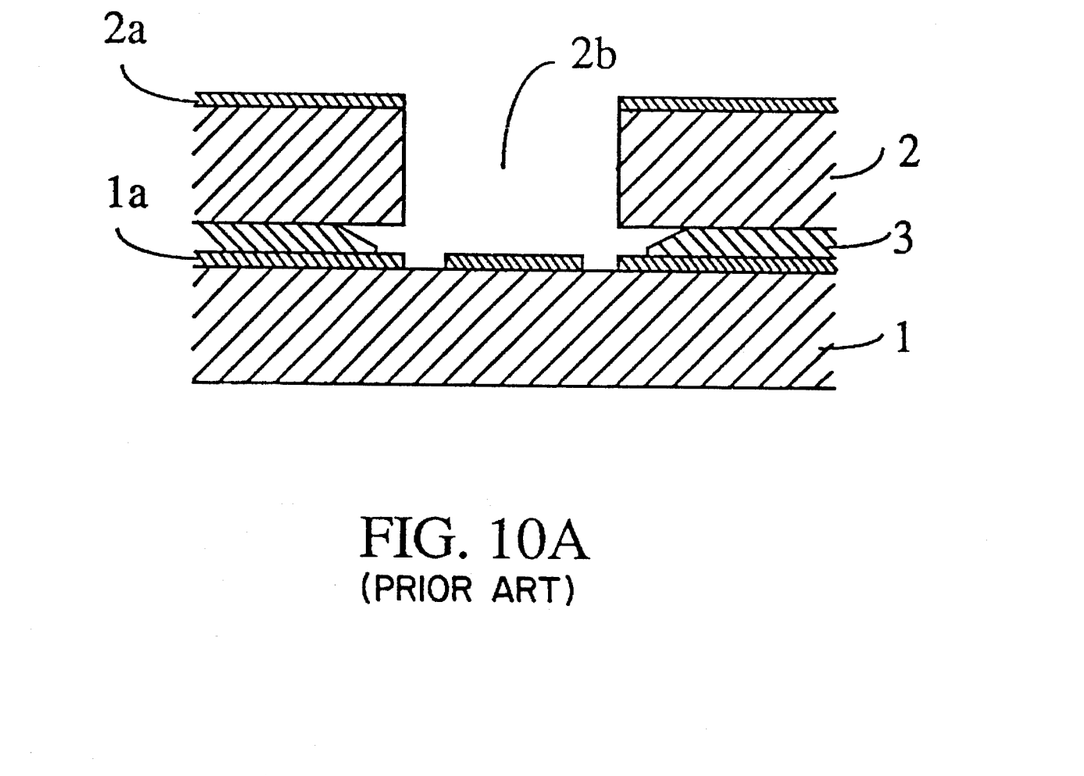
FIG. 10A and FIG. 10B are sectional views of a conventional method for manufacturing a multi-layer printed board.

FIG. 10A shows a sectional view of a conventional method for manufacturing a multi-layer printed board. In FIG. 10A, 1 is a lower layer board in the multi-layer printed board. 1a is a copper pattern formed on the board 1. 2 is an upper layer board having holes which is referred to below as a hole board. 2a is a copper pattern formed on the hole board 2. 2b is a hole portion in the hole board 2. 3 is a film-shaped adhesive. In FIG. 10A, the radius of the film-shaped adhesive is larger than that of the copper pattern formed on the board 1.

In the method for perforating large holes in the film-shaped adhesive rather than the printing hole board, if the holes of the film-shaped adhesive are larger than those of the printed board, an adhesion failure sometimes happens by the influence of decrease of the adhesion area as shown in FIG. 10A. And also, if a larger adhesion pressure is applied to the printed board for forcing the adhesive strength, the hole portion 2b of the upper layer board 2 happens to distort.

Figure 10B:
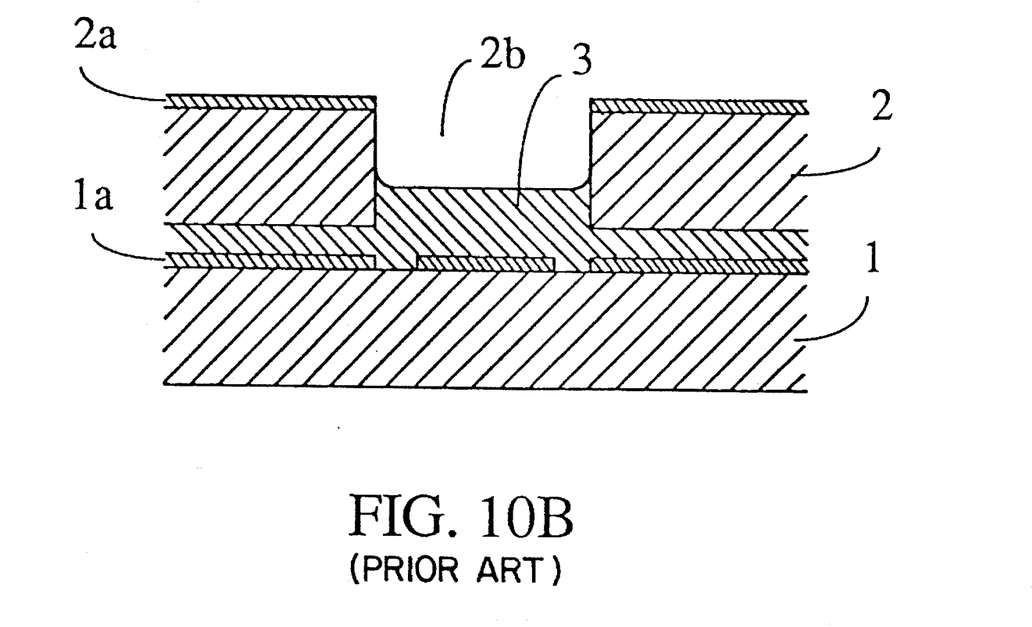

In the method for removing the extruded adhesive by using a hot knife as shown in FIG. 10B, the wiring patterns are sometimes damaged by the knife blade. Since it takes a lot of time to soften the adhesive using the hot knife, it takes a lot of time to remove the extruded adhesive in the holes 2b.

It is a primary object of the present invention to provide a method for producing a multi-layer printed board, in which the removing process of the adhesion extruded in the holes can be omitted, and also, the deformation of the holes can be avoided. Further, the amount of the adhesive can be economically used.

It is another object of the present invention to provide a method for producing a multi-layer printed board, in which thermoplastic resin sheet can be easily removed from the hole board after the printed board has been formed.

It is another object of the present invention to provide a method for producing a multi-layer printed board, in which the deformation of the multi-layer printed board can be easily controlled.

It is another object of the present invention to provide a method for producing a multi-layer printed board, in which high reliability of adhesion can be obtained.

SUMMARY OF THE INVENTION

A method for producing a multi-layer printed board of the present invention including a hole board at the top layer, a bottom layer board, and an adhesive sheet, having holes corresponding to the holes of the hole board of the top layer, which is located between the top layer hole board and the bottom layer board, comprises steps putting a fluororesin mold release sheet on the hole board of the top layer; putting a thermoplastic resin sheet on the fluororesin mold release sheet, wherein the thermoplastic resin sheet begins to soften at a temperature lower than the melting temperature of the adhesive, and has a heat resistance temperature higher than the curing temperature of the adhesive; and putting a contraction control member over the thermoplastic resin sheet, wherein the contraction control member controls contraction which occurs when the thermoplastic sheet cools.

Another method for producing a multi-layer printed board of the present invention including a hole board at the top layer, a bottom layer board, and an adhesive sheet, having holes corresponding to the holes of the hole board at the top layer, which is located between the top layer hole board and the bottom layer board, comprises steps: putting a thermoplastic resin sheet on the hole board at the top layer, wherein the thermoplastic resin sheet begins to soften at a temperature lower than the melting temperature of the adhesive, and has a heat resistance temperature higher than the curing temperature of the adhesive.

Another method for producing a multi-layer printed board of the present invention including a hole board at the top layer, a bottom layer board, and an adhesive sheet, having holes corresponding to the holes of the hole board at the top layer, which is located between the top layer hole board and the bottom layer board, comprises steps: putting a fluororesin mold release sheet on the hole board at the top layer; and putting a thermoplastic resin sheet on the fluororesin mold release sheet, wherein the thermoplastic resin sheet begins to soften at a temperature lower than the melting temperature of the adhesive, and has a heat resistance temperature higher than the curing temperature of the adhesive.

A method for producing a multi-layer printed board of the present invention further comprises steps: heating and the pressing the fluororesin mold release sheet, the thermoplastic resin sheet, the hole board at the top layer, the adhesive sheet and the bottom layer board on a curve-shaped metal mold.

Another method for producing a multi-layer printed board of the present invention including a hole board at the top layer, a bottom layer board, and an adhesive sheet, having holes corresponding to the holes of the hole board at the top layer, which is located between the top layer hole board and the bottom layer board, comprises steps: putting a fluororesin mold release sheet on the hole board at the top layer; putting a thermoplastic resin sheet on the fluororesin mold release sheet, wherein the thermoplastic resin sheet begins to soften at a temperature lower than the melting temperature of the adhesive, and has a heat resistance temperature higher than the curing temperature of the adhesive; and putting a contraction control member in the holes of the hole board at the top layer, wherein the contraction control member controls the contraction occurred by cooling of the thermoplastic sheet.

Another method for producing a multi-layer printed board of the present invention including a hole board at the top layer, a bottom layer board, and an adhesive sheet, having holes corresponding to the holes of the hole board at the top layer, which is located between the top layer hole board and the bottom layer board, comprises steps: putting a fluororesin mold release sheet on the hole board at the top layer; putting a thermoplastic resin sheet on the fluororesin mold release sheet, wherein the thermoplastic resin sheet begins to soften at a temperature lower than the melting temperature of the adhesive, and has a heat resistance temperature higher than the curing temperature of the adhesive; and putting an elastic filling agent on the thermoplastic resin sheet, wherein the elastic filling agent comprises a heat resistance resin having good mold release characteristics and is a little thicker than the hole board.

Another method for producing a multi-layer printed board of the present invention including a hole board at the top layer, a bottom layer board, and an adhesive sheet, having holes corresponding to the holes of the hole board at the top layer, which is located between the top layer hole board and the bottom layer board, comprises steps: filling agents in the hole of the hole board, wherein the filling agents comprise a heat resistance resin having good mold release characteristics; putting a fluororesin mold release sheet on the hole board at the top layer; and putting a thermoplastic resin sheet on the fluororesin mold release sheet, wherein the thermoplastic resin sheet begins to soften at a temperature lower than the melting temperature of the adhesive, and has a heat resistance temperature higher than the curing temperature of the adhesive.

DETAILED DESCRIPTION OF THE PREFERRED EMBODIMENTS

Embodiment 1

Figure 1A:
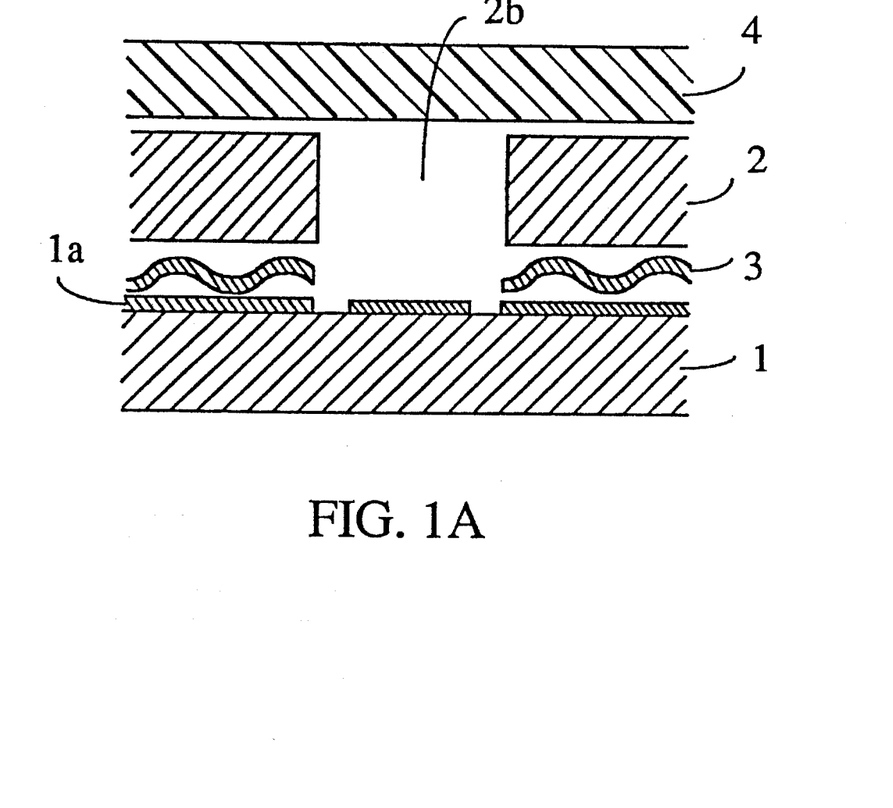
FIG. 1A and FIG. 1B are sectional views of a first embodiment for manufacturing a multi-layer printed board of the present invention.
Figure 1B:
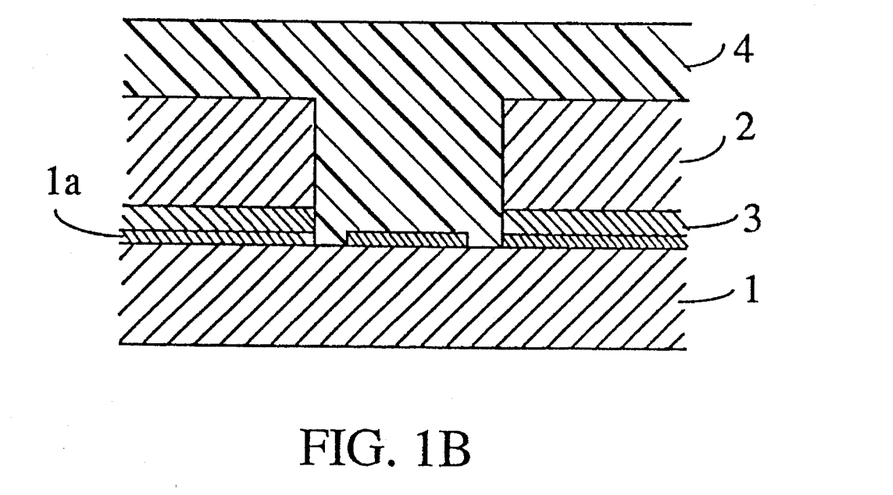

FIG. 1A and FIG. 1B are sectional views of a first embodiment for manufacturing a multi-layer printed board of the present invention. In FIG. 1, 1 is a lower layer board in the multi-layer printed board. 1a is a copper pattern formed on the board 1. 2 is an upper layer hole board. 2b is a hole portion in the hole board 2. 3 is a film-shaped adhesive. 4 is a thermoplastic resin sheet on the printed hole board 2. In this first embodiment, the film-shaped adhesive 3 having holes, which radius is about the same as that of the hole portion 2b of the hole board 2, is inserted between the upper layer hole board 2 and the lower layer board 1 so that the holes of film-shaped adhesive 3 correspond to the hole portions 2b. A thermoplastic resin sheet 4 is put on the upper layer hole board 2 at the opposite side of the film-shaped adhesive 3. The thermoplastic resin sheet is heated and pressed for manufacturing a multi-layer printed board.

With regard to the condition of the epoxy resin adhesive, it is appropriate to heat the multi-layer printed board at the rate of 2°~10° C./min, min, and to stop heating when the temperature reaches to the curing temperature and to hold that temperature while curing. With regard to the condition of the pressure, it is desirable to have a surface pressure for an initial pressure, to add a suitable pressure for the adhesive after reaching the curing temperature of the adhesive, and to hold that temperature until the forming is finished from the view point of adhesiveness.

In the above heating and pressure process, the thermoplastic resin 4 begins to soften at first while the multi-layer printed board is heated, then it is filled in the hole portions 2b of the hole board 2. Then the film-shaped adhesive 3 begins to melt between the upper layer hole board 2 and the lower layer board 1. But, since the thermoplastic resin 4 is already filled in the holes 2b of the upper layer hole board 2, the film-shaped adhesive 3 cures between the upper layer hole board 2 and the lower layer board 1 without extruding into the holes 2b. Therefore, the multi-layer printed board can be manufactured in which the adhesive 3 does not extrude into the holes 2b of the hole board 2.

The above board of the present invention is comprised of, for example, a glass reinforced epoxy resin board, an epoxy resin board including filling material, a glass reinforced fluororesin board, a fluororesin board including filling material.

When the hole board 2 is used as a multi-layer board, it is desirable to use a hole diameter larger than 1 mm, since the holes are filled by the heat deformation of the thermoplastic resin.

A copper pattern land 1a which diameter is larger than 0.5 mm exists on the lower layer board 1 in the holes 2b.

The adhesive used in the present invention is comprised of, for example, a film-shaped adhesive such as an epoxy resin adhesive film or a fluororesin adhesive film. The thickness of each adhesive is desirable to be 30~100 μm. The melting temperature is desirable to be 110°~130° C. for the epoxy resin adhesive, and 180°~200° C. for the fluororesin adhesive. The curing temperature is desirable to be 170°~180° C. for the epoxy resin adhesive, and 220°~230° C. for the fluororesin adhesive.

The thermoplastic resin sheet 4 used in the present invention is desirable to begin to soften at a temperature lower than the melting temperature of the adhesive, and desirable to have a heat resistance temperature higher than the curing temperature of the adhesive. The concrete examples are, for example, an acrylic resin or ABS resin as the epoxy resin adhesive, engineering plastic such as PEI or PES as the fluororesin adhesive. The thickness of thermoplastic resin sheet 4 is desirable, for example, to have thickness of 1~2 mm for the board having thickness of 0.5 mm from the view point of filling the holes with the thermoplastic resin.

One example of the first embodiment is shown in FIG. 1A and FIG. 1B. A glass reinforced epoxy resin board having thickness of 0.5 mm is used as the hole board 2 (first layer), and an epoxy film-shaped adhesive having thickness of 38 μm (melting point: 120° C., curing temperature 171°~177° C.) is used as the adhesive 3. Ten holes are perforated by the diameters of 1 mm, 1.5 mm and 2 mm, respectively, at the points corresponding to the above hole board 2 and the adhesive 3. The film-shaped adhesive 3 and the glass reinforced epoxy resin board 2 are laminated sequentially on the glass reinforced epoxy resin board 1 having copper pattern lands of diameter 0.5 mm, 1 mm and 1.5 mm on it. Then acrylic resin sheet 4 (softening temperature: 100° C.) having thickness of 1 mm is laminated on the glass reinforced epoxy resin board 2 as the thermoplastic resin 4. The sizes of the acrylic resin sheet 4, the hole board 1, 2 and the film-shaped adhesive 3 are 50 mm×100 mm, respectively.

The multi-layer printed board was adhered at the condition of an epoxy temperature increasing rate of 5° C./min, and curing condition of 175° C. for 60 min. The initial adhesive pressure is 5 kg/cm² and it increases up to 15 kg/cm² at the temperature of 120° C.

As shown in FIG. 1B, since the acrylic resin sheet 4 is filled completely into the hole portion 2b, the adhesive 3 does not extrude into the hole portion 2b.

Embodiment 2

Figure 2A:
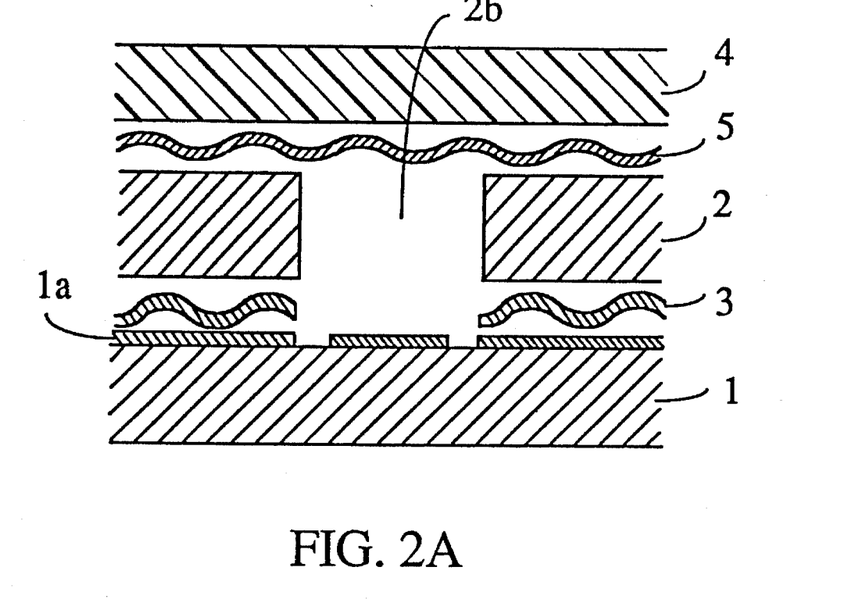
FIG. 2A and FIG. 2B are sectional views of a second embodiment for manufacturing a multi-layer printed board of the present invention.
Figure 2B:
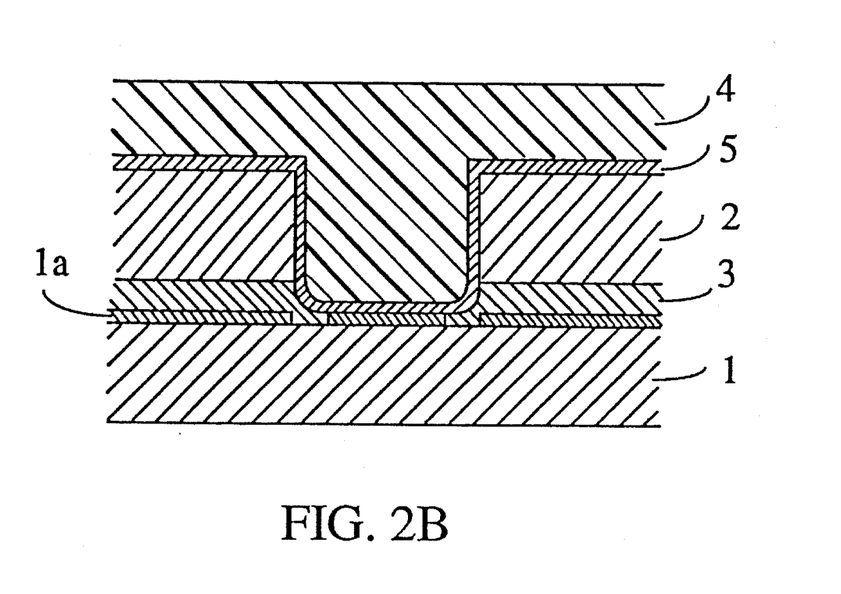

FIG. 2B and FIG. 2B are sectional views of a second embodiment for manufacturing a multi-layer printed board of the present invention.

In this second embodiment, mould release sheet 5 is put between the board 2 and the thermoplastic resin 4 as shown in FIG. 2B for easily releasing the thermoplastic resin 4 after the curing process is finished. Other process and the construction is the same as that of shown in FIG. 1A.

In this process, when the thermoplastic resin 4 reaches its softening temperature, the mould release sheet 5 is pushed and extended into the hole 2b by the pressure of the thermoplastic resin 4, and thus the thermoplastic resin 4 is filled on the extended mould release sheet 5 in the holes 2b. When the temperature further increases up to the melting temperature of the adhesive, the adhesive melts and adheres the board 2 and the board 1. When the temperature of the multi-layer board decreases after adhesion, the adhesive cures. The thermoplastic resin 4 is removed by removing the mould release sheet 5 after the multi-layer board is formed.

The mould release sheet 5 used in the present invention is desirably comprised of, for example, a fluororesin such as a polytetrafluoroethylene (PTFE) from the view point of the mould release and extension. The thickness of the mould release sheet 5 is desirably to be 40–60 μm.

One example of the second embodiment is shown in FIG. 2A and FIG. 2B. A glass reinforced epoxy resin board having thickness of 0.5 mm is used as the hole board 2, and an epoxy film-shaped adhesive having thickness of 38 μm (melting point: 120° C., curing temperature 171°~177° C.) is used as the adhesive 3. Ten holes are perforated by the diameters of 1 mm, 1.5 mm and 2 mm, respectively, at the points corresponding to the above hole board 2 and the adhesive 3. The film-shaped adhesive 3 and the glass reinforced epoxy resin board 2 are laminated sequentially on the glass reinforced epoxy resin board 1 having copper pattern lands of diameter 0.5 mm, 1 mm and 1.5 mm on it. Then, a fluororesin mold release sheet 5 having thickness of 50 μm { Nitoflon [trade mark] manufactured by Nitto Electric Technology Corporation} and the acrylic resin sheet (softening temperature: 100° C.) having thickness of 1 mm is laminated sequentially on the glass reinforced epoxy resin board 2 as the thermoplastic resin 4. The sizes of the acrylic resin sheet 4, the fluororesin mold release sheet 5, the hole board 1, 2 and the film-shaped adhesive 3 are 50 mm×100 mm, respectively.

The multi-layer printed board is adhered at the condition of an epoxy temperature increasing rate of 5° C./min, and curing condition of 175° C. for 60 min. The initial adhesive pressure is 5 kg/cm² and it increases up to 15 kg/cm² at the temperature of 120° C.

As shown in FIG. 2B, the acrylic resin sheet 4 is filled via the fluororesin mold release sheet 5 into the hole portion 2b. The adhesive 3 extruded only into the circumference of the hole portion 2b since the fluororesin mold release sheet 5 is not completely filled into the circumference of the hole portion 2b due to the lack of sheet extension. But, it is a negligible practical problem. Also, a release condition increases compared with the first embodiment.

Embodiment 3

Figure 3A:
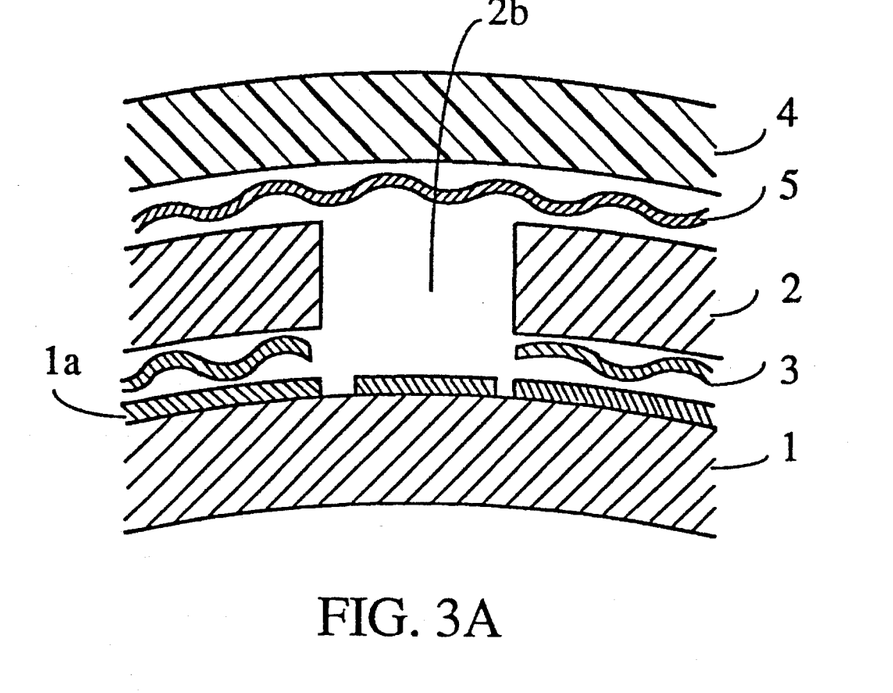
FIG. 3A and FIG. 3B are sectional views of a third embodiment for manufacturing a multi-layer printed board of the present invention.
Figure 3B:
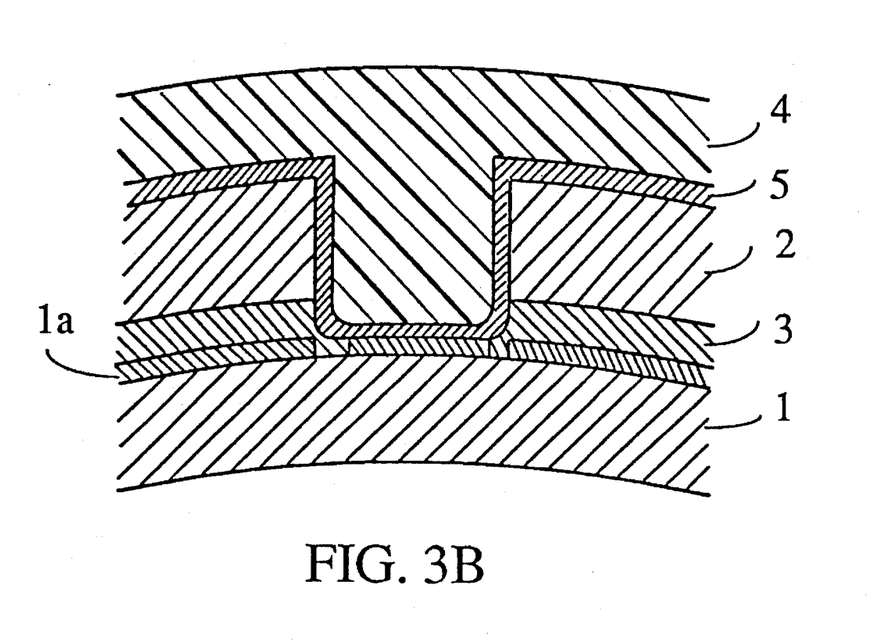

FIG. 3A and FIG. 3B are sectional views of a third embodiment for manufacturing a multi-layer printed board of the present invention.

In this third embodiment, the multi-layer printed board is formed to be a curved-shape using a curved-shape metal mold. Other process and the construction is the same as that of the second embodiment shown in FIG. 2B.

In this process, the mould release sheet 5 is used for manufacturing a multi-layer printed board in the same way shown in the second embodiment. The only difference from the second embodiment is in that this embodiment uses a curve-shaped metal mold for forming a curve-shaped multi-layer printed board. The thermoplastic resin 4, the mould release sheet 5, the hole board 2, the film-shaped adhesive 3 and the board 1 are put on the curve-shaped metal mold having a radius of curvature of 500–1000 mm and heated and pressed for forming a curve-shaped multi-layer printed board.

As described above, the film-shaped adhesive 3 does not extrude into the holes 2b as shown in the second embodiment. By manufacturing the multi-layer printed board so as to fit to the body of the electric device, it is possible to obtain small-size and high density mounting products.

One example of the third embodiment is explained below, which has a surface curvature of the multi-layer board. A glass reinforced epoxy resin board having thickness of 0.5 mm is used as the hole board 2, and an epoxy film-shaped adhesive having thickness of 38 μm (melting point: 120° C., curing temperature 171°~177° C.) is used as the adhesive 3 and a board of thickness of 1.7 mm having copper surfaces at both sides is used as a top board 7. 30 holes having diameters of 1.5 mm are perforated at the points corresponding to the above hole board 2, the adhesive 3 and a board 7. The film-shaped adhesive 3 and the glass reinforced epoxy resin board 2 are laminated sequentially on the glass reinforced epoxy resin board 1. Then, a fluororesin mold release sheet {Nitoflon [trade mark] } 5 having thickness of 50 μm and the acrylic resin sheet (softening temperature: 100° C.), as the thermoplastic resin 4, having thickness of 1 mm, are laminated sequentially on the glass reinforced epoxy resin board 2. The sizes of the top board 7, the fluororesin mold release sheet 5, the hole board 1, 2 and the film-shaped adhesive 3 are 50 mm×100 mm, respectively. The size of the acrylic resin sheet 4 is 45 mm×90 mm.

The multi-layer printed board is adhered at the condition of an epoxy temperature increasing rate of 5° C./min, and curing condition of 175° C. for 60 min. The initial adhesive pressure is 5 kg/cm² and it increases up to 15 kg/cm² at the temperature of 120° C.

As shown in FIG. 2B, the acrylic resin sheet 4 is filled into the hole portion 2b via the fluororesin mold release sheet 5. The adhesive 3 extrudes only into the circumference of the hole portion 2b since the fluororesin mold release sheet 5 is not completely filled into the circumference of the hole portion 2b due to the lack of sheet extension. But, it is a negligible practical problem. Also, a release condition increases compared with the first embodiment.

Embodiment 4

Figure 4A:
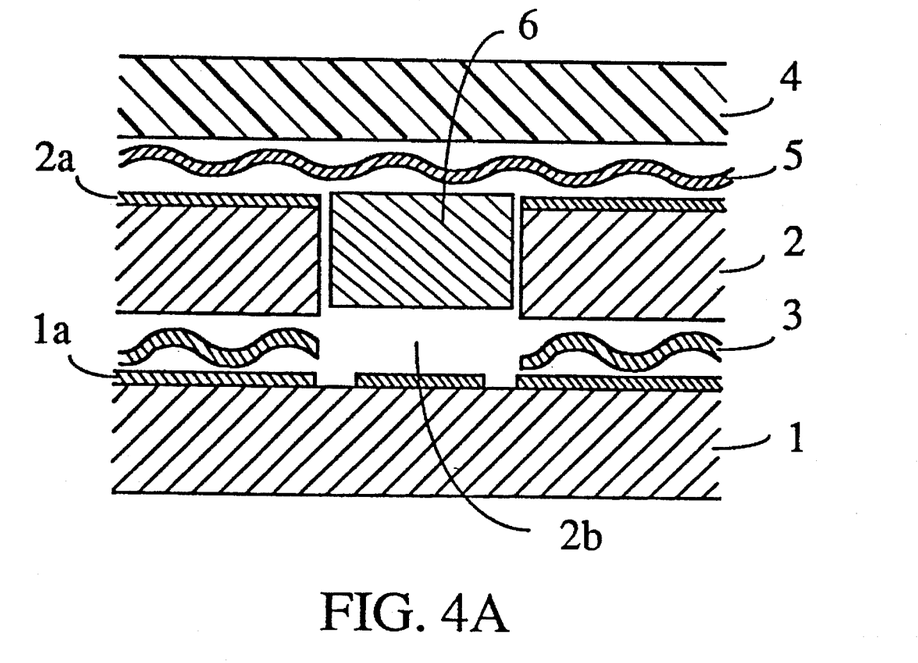
FIG. 4A and FIG. 4B are sectional views of a fourth embodiment for manufacturing a multi-layer printed board of the present invention.
Figure 4B:
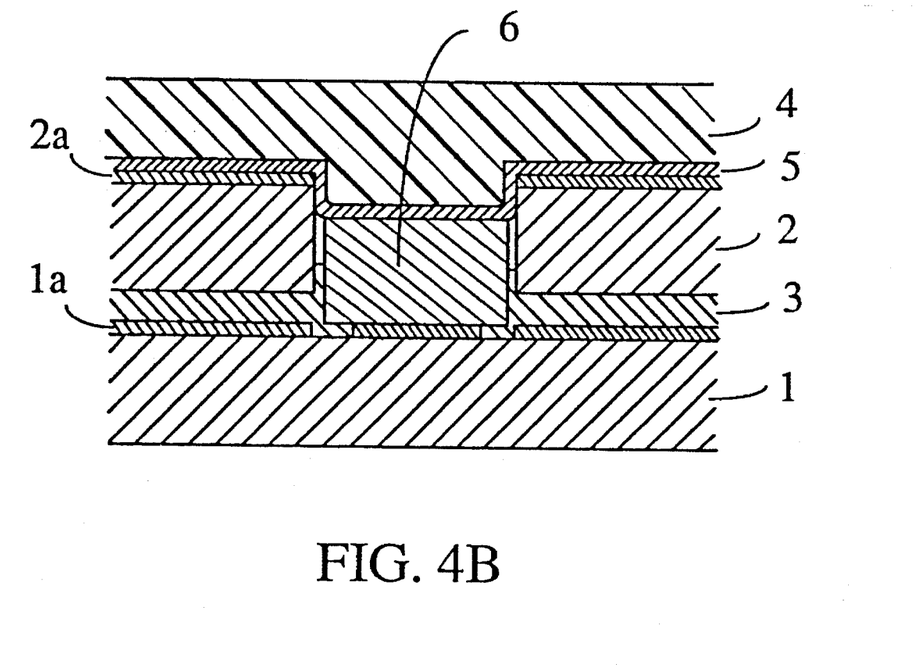

FIG. 4A and FIG. 4B are sectional views of a fourth embodiment for manufacturing a multi-layer printed board of the present invention.

In this fourth embodiment, an elastic filling agent is filled in the holes of the hole board in advance. The elastic filling agent comprises a heat resistance resin having good mold release characteristics and is a little thicker than the hole board.

The elastic filling agent can be any agent so long as it has elastic and good mold release characteristics. The fluororesin, such as NITOFLON (Trademark), is a concrete example of the elastic filling resin. The thickness of the elastic filling agent is desirable to be thicker by thickness of the film-shaped adhesive than that of the hole board, and to be thinner than thickness so the adhesive does not extrude from the hole board while pressure is applied. For example, in case that the thickness of the film-shaped adhesive is 38 microns, the thickness of the elastic filling agent is desirable to be 50–100 microns thicker than the whole board. The diameter of the elastic filling agent is desirable to be the same or up to 100 microns larger than the hole of hole board. The heating condition and the pressure condition are the same of those of the embodiment 1.

One example of the fourth embodiment is shown in FIG. 4A. A glass reinforced epoxy resin board having thickness of 0.5 mm is used as the hole board 2, and an epoxy film-shaped adhesive having thickness of 38 μm (melting point: 120° C., curing temperature 171°~177° C.) is used as the adhesive 3. 30 holes having diameters of 1.5 mm are perforated at the points corresponding to the above hole board 2 and the adhesive 3. Elastic filling agent 6, which is comprised of fluororesin { Nitoflon [trade mark] } having thickness of 0.45 mm and diameter of 1.5 mm, are filled in all holes 2b of the glass reinforced epoxy resin board 2. The film-shaped adhesive 3 having holes and the glass reinforced epoxy resin board 2 filled with the elastic filling agent in its holes are laminated sequentially on the glass reinforced epoxy resin board 1. The sizes of the board 1, the hole 2 and the film-shaped adhesive 3 are 50 mm×100 mm, respectively.

The multi-layer printed board is adhered at the condition of an epoxy temperature increasing rate of 5° C./min, and curing condition of 175° C. for 60 min. The initial adhesive pressure is 5 kg/cm² and it increases up to 15 kg/cm² at the temperature of 120° C.

The adhesive 3 does not extrude into the hole portions 2b after the adhesion is finished since the fluororesin elastic filling agent 6 is filled in the holes 2b. In this fourth embodiment, there is no adhesion failure around the holes 2b, and it is very easy to pull out the fluororesin elastic filling agent 6 after the multi-layer printed board is formed.

Also, because the adhesive does not extrude into the holes 2b, it is not necessary to take out the adhesive 3. Accordingly, a designed amount of adhesive can be efficiently used without occurrence of adhesion failure in the multi-layer board. Further, since it does not necessarily apply overpressure to the multi-layer board, it is easy to control the deformation of the multi-layer board. Therefore, high reliability of adhesion is obtained.

Embodiment 5

Figure 5A:
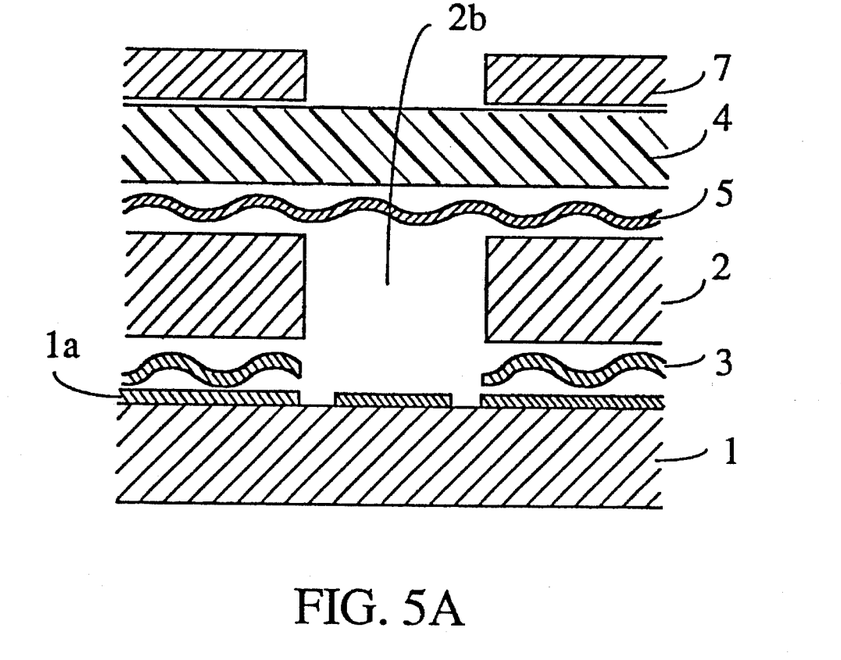
FIG. 5A and FIG. 5B are sectional views of a fifth embodiment for manufacturing a multi-layer printed board of the present invention.
Figure 5B:
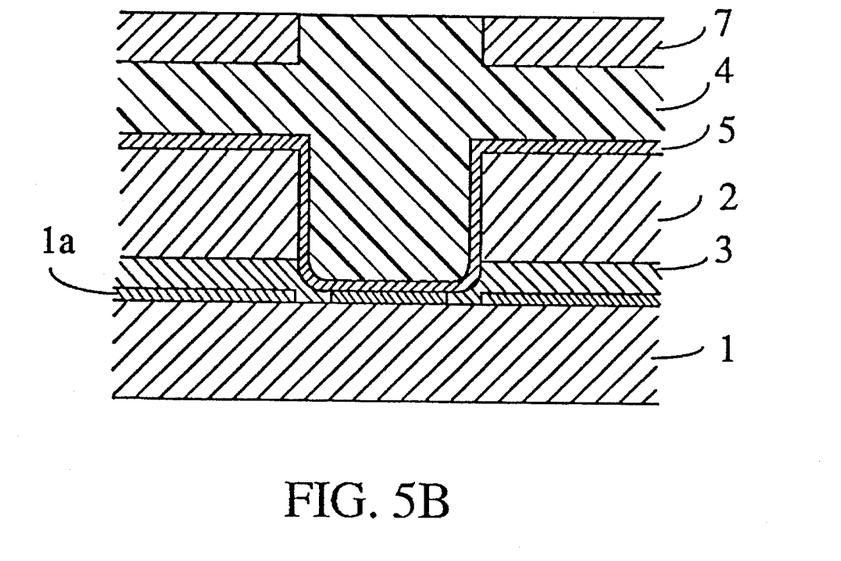

FIG. 5A and FIG. 5B are sectional views of a fifth embodiment for manufacturing a multi-layer printed board of the present invention.

In this fifth embodiment, a contraction control member having holes is used for controlling the contraction which occurs by cooling of the thermoplastic sheet.

The contraction control member is desirable to have substantially the same linear expansion coefficient as that of the hole board. Some of the concrete examples are a hole board having copper surfaces at both sides and a glass reinforced cloth epoxy resin board having holes.

The holes of the contraction control member having holes do not necessarily correspond to the holes of the hole board.

In this fifth embodiment, the mold release sheet, thermoplastic resin sheet and the contraction control member are laminated sequentially on the hole board, and they are heated and pressed. The mold release sheet and the thermoplastic resin sheet are the same as those in the second embodiment. The heating condition and the pressure condition are the same as those in the first embodiment.

In this fifth embodiment, the adhesive cures without extruding into the same hole portion as that in the second embodiment. Since the contraction control member, such as the board having copper surfaces at both sides controls the contraction occurred by cooling of the plastic resin sheet, the camber occurring in the multi-layer board can be controlled.

One example of the fifth embodiment is explained below. A glass reinforced epoxy resin board having thickness of 0.5 mm is used as the hole board 2, and an epoxy film-shaped adhesive having thickness of 38 μm (melting point: 120° C., curing temperature 171°~177° C.) is used as the adhesive 3 and a board of thickness of 1.7 mm having copper surfaces at both sides is used as a top board 7. Copper patterns (not shown) may be formed on hole board 2 (see FIG. 4a). 30 holes having diameters of 1.5 mm are perforated at the points corresponding to the above hole board 2, the adhesive 3 and a board 7. The film-shaped adhesive 3 and the glass reinforced epoxy resin board 2 are laminated sequentially on the glass reinforced epoxy resin board 1. Then, a fluororesin mold release sheet {Nitoflon [trade mark] } 5 having thickness of 50 μm and the acrylic resin sheet (softening temperature: 100° C.), as the thermoplastic resin 4, having thickness of 1 mm, and the board 7 are laminated sequentially on the glass reinforced epoxy resin board 2. The sizes of the top board 7, the fluororesin mold release sheet 5, the hole board 2, the printed board 1 and the film-shaped adhesive 3 are 50 mm×100 mm, respectively. The size of the acrylic resin sheet 4 is 45 mm×90 mm.

The multi-layer printed board is adhered at the condition of an epoxy temperature increasing rate of 5° C./min, and curing condition of 175° C. for 60 min. The initial adhesive pressure is 5 kg/cm² and it increased up to 15 kg/cm² at the temperature of 120° C.

As shown in FIG. 5B, the acrylic resin sheet 4 is filled into the hole portion 2b via the fluororesin mold release sheet 5 and also filled into the hole portion of the top board 7. The adhesive 3 extrudes only into the circumference of the hole portion 2b since the fluororesin mold release sheet 5 is not completely filled into the circumference of the hole portion 2b due to the lack of sheet extension. But, it is a negligible practical problem. Also, any deformation does not occur in the multi-layer printed board.

Embodiment 6

Figure 6A:
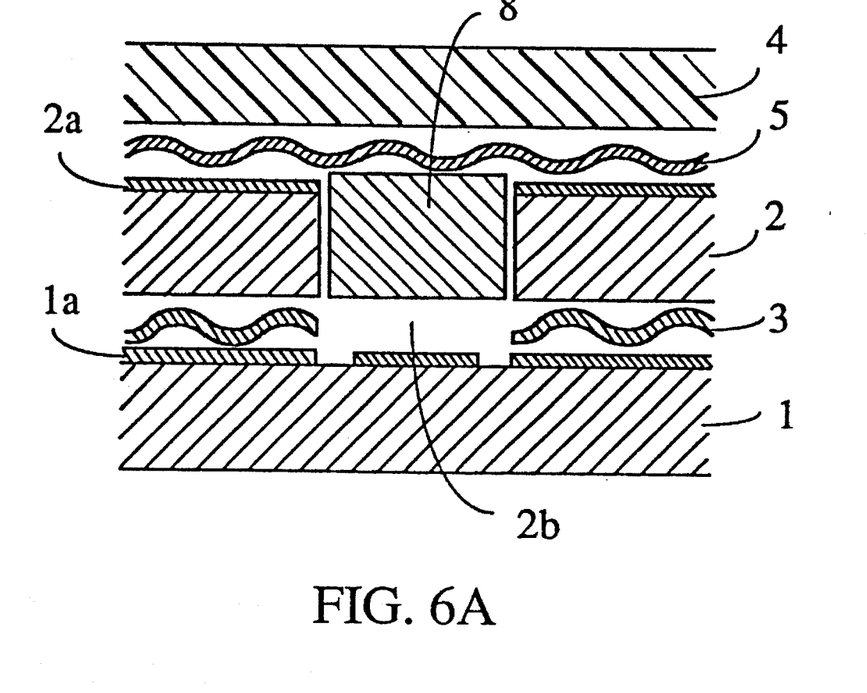
FIG. 6 and FIG. 6B are sectional views of a sixth embodiment for manufacturing a multi-layer printed board of the present invention.

FIG. 6A is a sectional view of a sixth embodiment for manufacturing a multi-layer printed board of the present invention.

In this sixth embodiment, a filling agent 8 is filled in the holes 2b of the hole board 2 in advance. The filling agent 8 comprises a heat resistance resin having good mold release characteristics. The mold release sheet 5 and thermoplastic resin sheet 4 are laminated on the filling agent 8.

The fluororesin comprises the thermoplastic resin such as Nitoflon [trade mark], which is a concrete example of the filling resin. The thickness of the filling agent 8 is desirable to be 0~100 μm thicker than the hole board 2 or 0~500 μm thinner than the hole board 2. The diameter of the filling agent 8 is desirable to be the same or up to 100 μm larger than the hole 2b of the hole board 2.

The mold release sheet 5 and thermoplastic resin sheet 4 are the same as that in the embodiment 2. The heating condition and the pressure condition are the same as those of the embodiment 1.

Figure 6B:
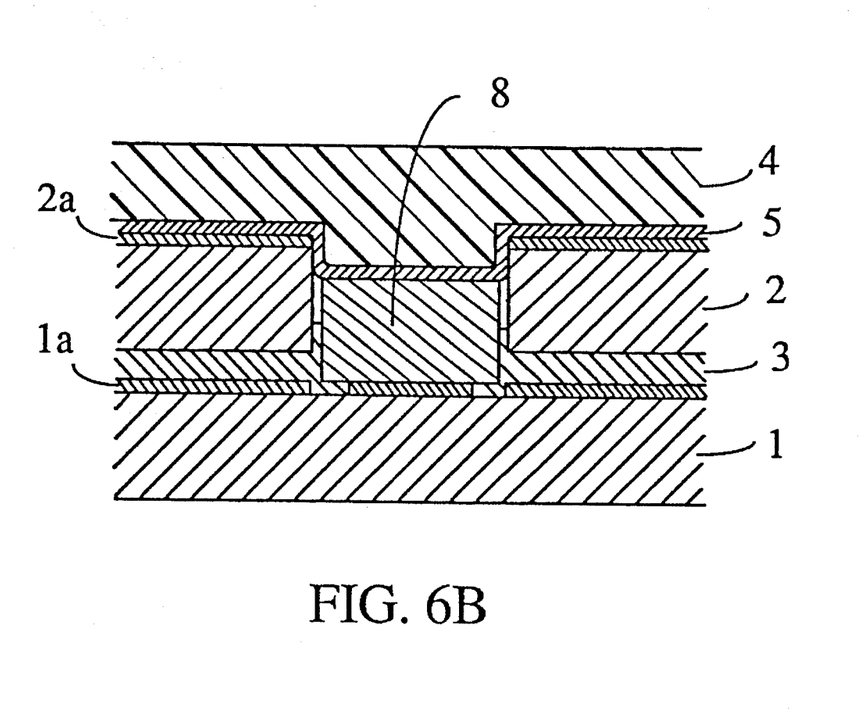

In this embodiment, the adhesive 3 does not flow into the hole portion 2b of the hole board 2 even if the adhesive 3 melts while the temperature is increasing. If the filling agent is thinner than the hole board 2, the hole portion 2b is not filled by the adhesive 3, since the filling portion 2b is filled by the thermoplastic resin sheet 4 and the mold release sheet 5 which are deformed by the heat as shown in FIG. 6B.

One example of the sixth embodiment is shown in FIG. 6A. In this embodiment, fluororesin having thickness of 0.55 mm and diameter of 1.5 mm is used as a filling member.

The filling agents 8, having thickness of 0.55 mm and diameter 1.5 mm, are filled in advance into all 30 holes 2b, having 1.5 mm diameter, of the hole board 2, having thickness of 0.5 mm, which comprises a glass reinforced epoxy resin. A glass reinforced epoxy resin board having thickness of 0.5 mm is used as the hole board 2, and an epoxy film-shaped adhesive having thickness of 38 μm is used as the adhesive 3. 2a is a copper pattern formed on the hole board 2. 30 holes having diameters of 1.5 mm are perforated at the points corresponding to the above hole board 2 and the adhesive 3. The film-shaped adhesive 3, the glass reinforced epoxy resin board 2, the fluororesin mold release sheet 5 having thickness of 50 μm and the acrylic resin sheet 4 having thickness of 1 mm, are laminated sequentially on the glass reinforced epoxy resin board 1. The sizes of the fluororesin mold release sheet 5, the hole board 2, the printed board 1 and the film-shaped adhesive 3 are 50 mm×100 mm, respectively. The size of the acrylic resin sheet 4 is 45 mm×90 mm.

The multi-layer printed board is adhered at the condition of an epoxy temperature increasing rate of 5° C./min, and curing condition of 175° C. for 60 min. The initial adhesive pressure is 5 kg/cm² and it increases up to 15 kg/cm² at the temperature of 120° C.

As shown in FIG. 6B, since the filling agents 8 is filled into the hole portion 2b the adhesive 3 does not extrude into the hole portion 2b. Also, there is no adhesive failure around the hole portion 2b. Further, it is easy to take out the fluororesin filling agent 8 from the holes 2b after the formation of the multi-layer printed board is finished.

Comparison example 1

Figure 7A:
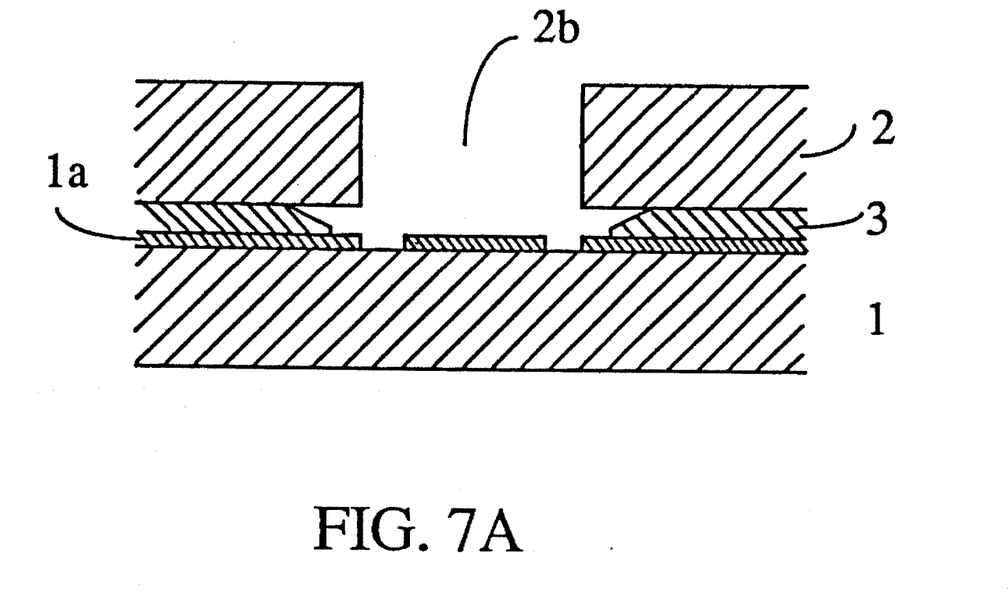
FIG. 7A and 7B are sectional views of a first comparison example for manufacturing a multi-layer printed board of the present invention.
Figure 7B:
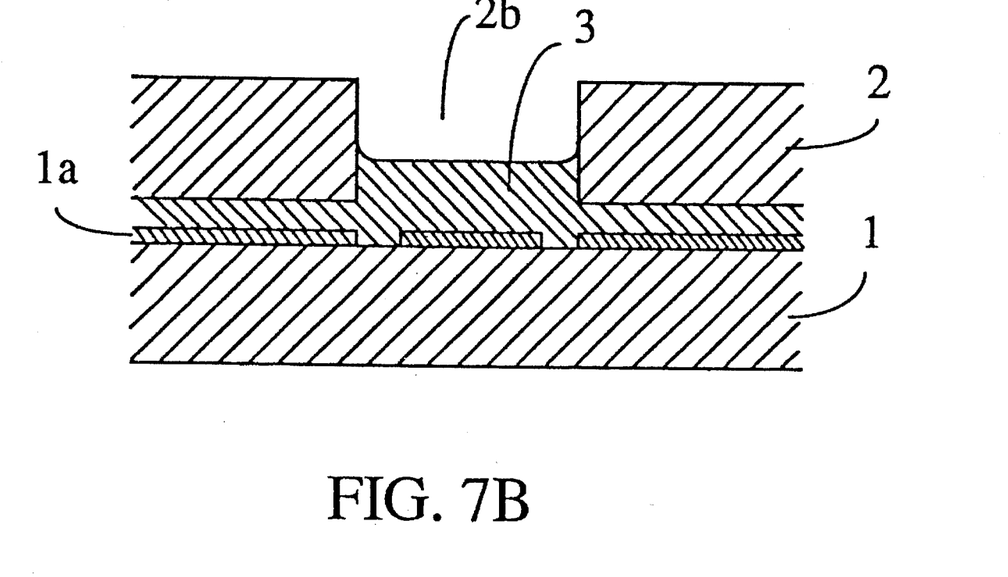

FIG. 7A and 7B are sectional views of a first comparison example for manufacturing a multi-layer printed board of the present invention.

The first comparison sample is experimented as shown in FIG. 7A which is the same as the first embodiment shown in FIG. 1A except the acrylic resin sheet 4. A glass reinforced epoxy resin board having thickness of 0.5 mm is used as the hole board 2 (first layer), and an epoxy film-shaped adhesive having thickness of 38 μm (melting point: 120° C., curing temperature 171°~177° C.) is used as the adhesive 3. Ten holes are perforated by the diameters of 1 mm, 1.5 mm and 2 mm, respectively, at the points corresponding to the above hole board 2 and the adhesive 3. The film-shaped adhesive 3 and the glass reinforced epoxy resin board 2 are laminated sequentially on the glass reinforced epoxy resin board 1. The sizes of the hole board 1, 2 and the film-shaped adhesive 3 are 50 mm×100 mm, respectively.

The multi-layer printed board is adhered at the condition of an epoxy temperature increasing rate of 5° C./min, and curing condition of 175° C. for 60 min. The initial adhesive pressure is 5 kg/cm² and it increases up to 15 kg/cm² at the temperature of 120° C.

The experimental result showed that the adhesive 3 extruded into all hole portions 2b as shown in FIG. 7B.

Comparison example 2

Figure 8A:
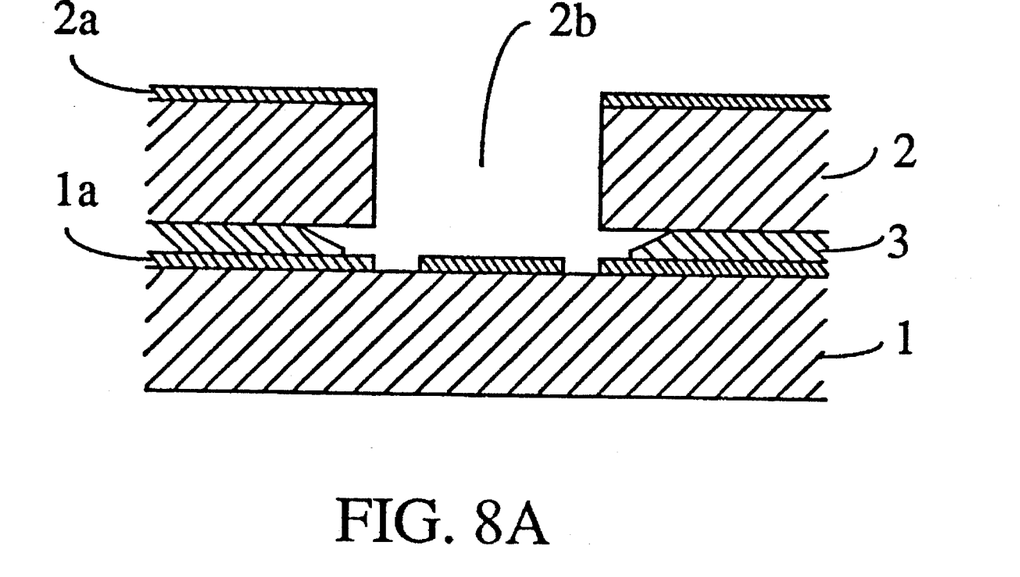
FIG. 8A and FIG. 8B are sectional views of a second comparison example for manufacturing a multi-layer printed board of the present invention.

FIG. 8A is a sectional view of a second comparison example for manufacturing a multi-layer printed board of the present invention.

A second comparison sample is experimented as shown in FIG. 8A which is the same as the sixth embodiment shown in FIG. 6A except the filling agents 8, the acrylic resin sheet 4 and the fluororesin mold release sheet 5. A glass reinforced epoxy resin board having thickness of 0.5 mm is used as the hole board 2, and an epoxy film-shaped adhesive having thickness of 38 μm, is used as the adhesive 3. 30 holes having diameters of 1.5 mm are perforated at the points corresponding to the above hole board 2 and the adhesive 3. The film-shaped adhesive 3, the glass reinforced epoxy resin board 2 are laminated sequentially on the glass reinforced epoxy resin board 1. The sizes of the hole board 2, the printed board 1 and the film-shaped adhesive 3 are 50 mm×100 mm, respectively.

Figure 8B:
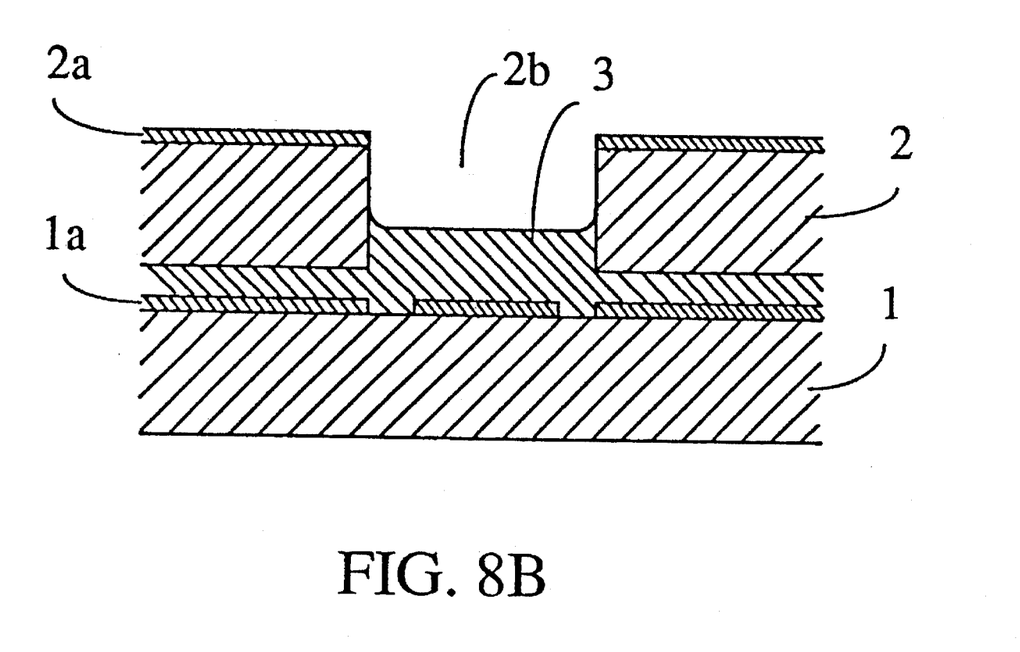

The multi-layer printed board is adhered at the condition of an epoxy temperature increasing rate of 5° C./min, and curing condition of 175° C. for 60 min. The initial adhesive pressure is 5 kg/cm² and it increases up to 15 kg/cm² at the temperature of 120° C.

The experimental result of this comparison example showed that the adhesive 3 extruded into all hole portions 2b as shown in FIG. 8B.

Comparison example 3

Figure 9A:
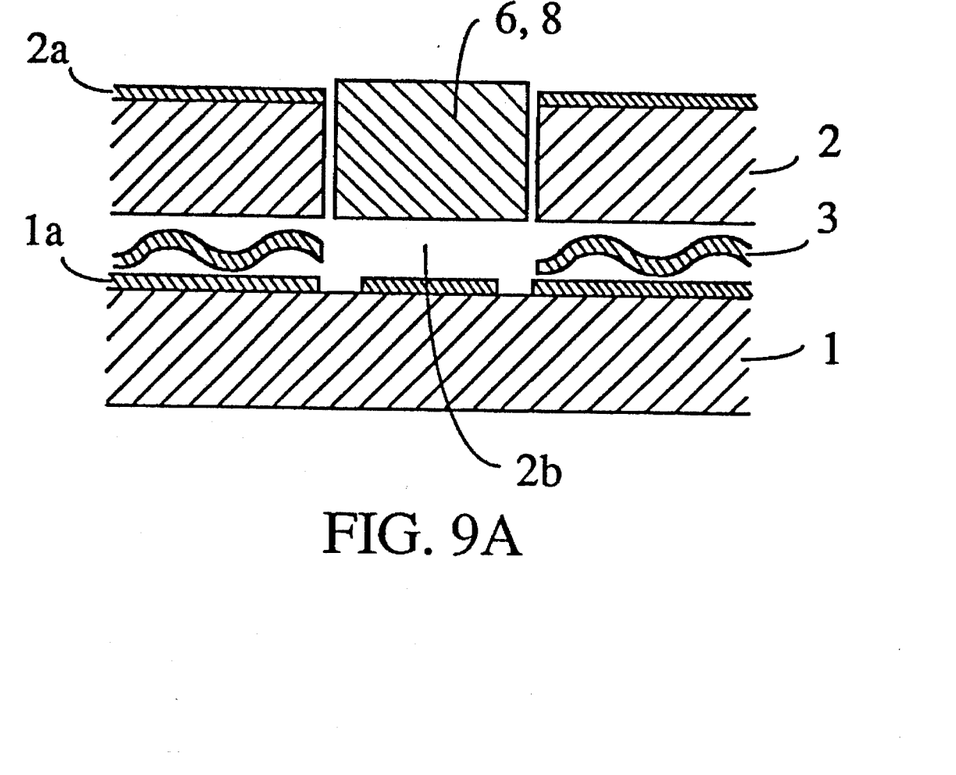
FIG. 9A and FIG. 9B are sectional views of a third comparison example for manufacturing a multi-layer printed board of the present invention.
Figure 9B:
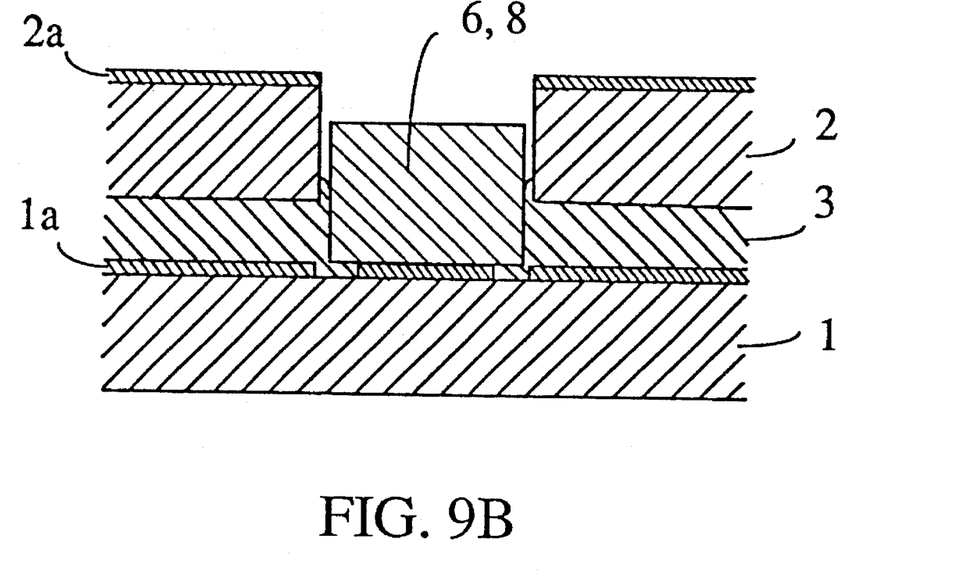

FIG. 9A and FIG. 9B are sectional view of a third comparison example for manufacturing a multi-layer printed board of the present invention.

A third comparison sample is experimented as shown in FIG. 9A which is the same as the sixth embodiment shown in FIG. 6A except the acrylic resin sheet 4 and the fluororesin mold release sheet 5. In this experiment, 30 holes having diameters of 1.5 mm are perforated at the points corresponding to the above hole board 2 and the adhesive 3. The elastic filling agents 6 and filling agents 8 are filled in the 30 holes 2b, having diameters of 1.5 mm, of the hole board 2 having thickness of 0.5 mm. Each elastic filling agent 6 and the filling agent 8 has thickness of 0.45 mm and diameter of 1.5 mm. A glass reinforced epoxy resin board having thickness of 0.5 mm is used as the hole board 2, and an epoxy film-shaped adhesive having thickness of 38 μm is used as the adhesive 3. 2a is a copper pattern formed on the hole board 2. The film-shaped adhesive 3, the glass reinforced epoxy resin board 2, having the filling agents 6 and filling agents 8 in its holes 2b, are laminated sequentially on the glass reinforced epoxy resin board 1. The sizes of the hole board 2, the printed board 1 and the film-shaped adhesive 3 are 50 mm×100 mm, respectively.

The multi-layer printed board is adhered at the condition of an epoxy temperature increasing rate of 5° C./min, and curing condition of 175° C. for 60 min. The initial adhesive pressure is 5 kg/cm² and it increases up to 15 kg/cm² at the temperature of 120° C.

The experimental result of this comparison example showed that the adhesive 3 extruded into 14 holes out of 30 holes as shown in FIG. 9B.

Those skilled in the art will recognize that many modifications to the foregoing description can be made without departing from the spirit of the invention. The foregoing description is intended to be exemplary and in no way limiting. The scope of the invention is defined in the appended claims and equivalents thereto.

What is claimed is:

1. A method for producing a multi-layer printed board by heating and pressing, the multi-layer printed board having a hole board as a top layer, a bottom layer board, and an adhesive sheet having holes corresponding to the holes in the hole board and being located between the hole board and the bottom layer board, the method comprising the steps of:

putting a fluororesin mold release sheet on the hole board;

punting a thermoplastic resin sheet on said fluororesin mold release sheet, wherein said thermoplastic resin sheet begins to soften at a temperature lower than the melting temperature of the adhesive, and has a heat resistance temperature higher than the curing temperature of the adhesive; and, putting a contraction control member over said thermoplastic resin sheet, wherein said contraction control member controls contraction of said thermoplastic resin sheet which occurs when said thermoplastic sheet cools.

2. The method of claim 1 wherein the contraction control member includes a hole board having copper surfaces.

3. The method of claim 1 wherein the contraction control member includes a glass reinforced cloth epoxy resin board having holes.

4. The method of claim 1 wherein the contraction control member has a coefficient of linear expansion which is substantially the same as the coefficient of linear expansion of the hole board.

5. The method of claim 1 wherein the contraction control member has holes.

6. A method for producing a multi-layer printed board having a hole board as a top layer, a bottom layer board, and an adhesive sheet having holes corresponding to the holes in the hole board and being located between the hole board and the bottom layer board, the method comprising the steps of:

providing a mold release sheet on the hole board;

providing a thermoplastic resin sheet on the mold release sheet;

putting a contraction control member over the thermoplastic resin sheet;

heating and pressing the hole board, the bottom layer board, the adhesive, the mold release sheet, the thermoplastic resin sheet, and the contraction control member to form a multi-layer printed board, wherein the thermoplastic resin sheet begins to soften at a temperature lower than the melting temperature of the adhesive;

allowing the multi-layer printed board to cool, wherein the contraction control member controls contraction of the thermoplastic resin sheet which occurs when the thermoplastic sheet cools; and separating the mold release sheet, thermoplastic resin sheet, and contraction control member from the multi-layer printed board.

7. The method of claim 6 wherein the contraction control member includes a hole board having copper surfaces.

8. The method of claim 6 wherein the contraction control member includes a glass reinforced cloth epoxy resin board having holes.

9. The method of claim 6 wherein the contraction control member has a coefficient of linear expansion which is substantially the same as the coefficient of linear expansion of the hole board.

10. The method of claim 6 wherein the contraction control member has holes.

* * * * *

UNITED STATES PATENT AND TRADEMARK OFFICE

CERTIFICATE OF CORRECTION

PATENT NO. : 5,460,680

DATED : October 24, 1995

INVENTOR(S): Shoji Yamaguchi; Akira Yamada; Yasuo Furuhashi and Fumiaki Baba

It is certified that error appears in the above-identified patent and that said Letters Patent is hereby corrected as shown below:

Column 3, line 60, please change "FIG. 6" to -- FIG. 6A --.
Column 4, line 31, delete "min", second occurrence.
Column 12, line 15 change "glass reinforced cloth epoxy" to -- glass cloth reinforced epoxy --.
Column 12, line 52 change "glass reinforced cloth epoxy" to -- glass cloth reinforced epoxy --.

Signed and Sealed this

Sixth Day of August, 1996

Attest:

BRUCE LEHMAN

Attesting Officer

Commissioner of Patents and Trademarks